(12) United States Patent
Cai et al.

(10) Patent No.: US 8,846,477 B2
(45) Date of Patent: Sep. 30, 2014

(54) METHODS OF FORMING 3-D SEMICONDUCTOR DEVICES USING A REPLACEMENT GATE TECHNIQUE AND A NOVEL 3-D DEVICE

(71) Applicant: GLOBALFOUNDRIES Inc., Grand Cayman (KY)

(72) Inventors: Xiuyu Cai, Albany, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 13/628,914

(22) Filed: Sep. 27, 2012

(65) Prior Publication Data

US 2014/0084383 A1    Mar. 27, 2014

(51) Int. Cl.
*H01L 21/336* (2006.01)
*H01L 21/20* (2006.01)
*H01L 21/36* (2006.01)
*H01L 27/108* (2006.01)
*H01L 29/76* (2006.01)
*H01L 29/94* (2006.01)
*H01L 31/119* (2006.01)
*H01L 31/062* (2012.01)
*H01L 31/113* (2006.01)
*H01L 23/34* (2006.01)

(52) U.S. Cl.
USPC ........... 438/286; 438/284; 438/399; 438/478; 257/308; 257/401; 257/722

(58) Field of Classification Search
USPC .......... 438/284, 286, 399, 478; 257/722, 308, 257/401
See application file for complete search history.

(56) References Cited

U.S. PATENT DOCUMENTS

2008/0169490 A1*  7/2008  Kawai ........................... 257/288
2012/0261643 A1* 10/2012  Cohen et al. ..................... 257/27

* cited by examiner

*Primary Examiner* — Matthew Reames
*Assistant Examiner* — Dilinh Nguyen
(74) *Attorney, Agent, or Firm* — Amerson Law Firm, PLLC

(57) ABSTRACT

One illustrative method disclosed herein includes forming a sacrificial gate structure above a fin, wherein the sacrificial gate structure is comprised of a sacrificial gate insulation layer, a layer of insulating material, a sacrificial gate electrode layer and a gate cap layer, forming a sidewall spacer adjacent opposite sides of the sacrificial gate structure, removing the sacrificial gate structure to thereby define a gate cavity that exposes a portion of the fin, and forming a replacement gate structure in the gate cavity. One illustrative device disclosed herein includes a plurality of fin structures that are separated by a trench formed in a substrate, a local isolation material positioned within the trench, a gate structure positioned around portions of the fin structures and above the local isolation material and an etch stop layer positioned between the gate structure and the local isolation material within the trench.

16 Claims, 19 Drawing Sheets

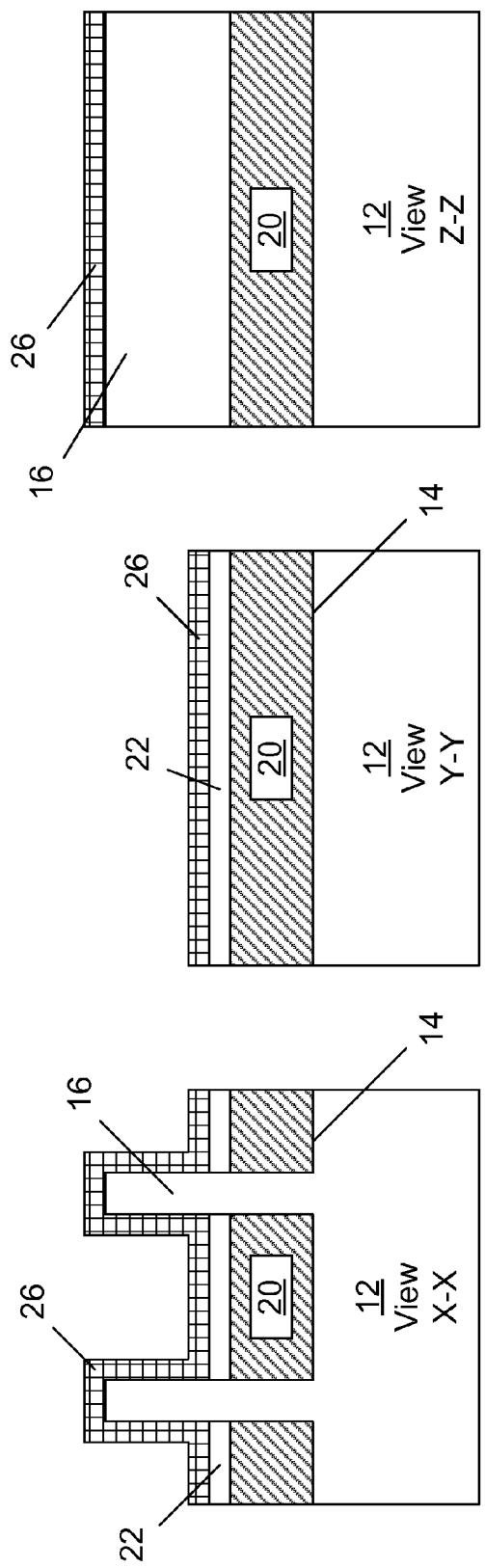

METHODS OF FORMING 3-D SEMICONDUCTOR DEVICES USING A REPLACEMENT GATE TECHNIQUE AND A NOVEL 3-D DEVICE

BACKGROUND OF THE INVENTION

1. Field of the Invention

Generally, the present disclosure relates to the manufacture of sophisticated semiconductor devices, and, more specifically, to various methods of forming 3-D semiconductor devices, such as FinFET devices, using a replacement gate technique, and a novel 3-D device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3-D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device manufacturers are under constant pressure to produce integrated circuit products with increased performance and lower production costs relative to previous device generations. Thus, device designers spend a great amount of time and effort to maximize device performance, while seeking ways to reduce manufacturing costs and improve manufacturing reliability. As it relates to 3D devices, device designers have spent many years and employed a variety of techniques in an effort to improve the performance capability and reliability of such devices.

For many early device technology generations, the gate structures of most transistor elements have been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-20 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a FinFET device with a high-k/metal gate structure is the so-called "gate last" or "replacement gate" technique. As it relates to the formation of the sacrificial and replacement gate structures, one typical replacement gate technique generally involves the following steps: 1) performing an etching process through a patterned mask layer to define a plurality of trenches in a semiconducting substrate which thereby defines a plurality of fin structures; 2) over-filling the trenches with an insulating material, such as silicon dioxide; 3) performing a chemical mechanical polishing (CMP) process using the hard mask layer as a polish-stop to remove excess amounts of the insulating material; 4) performing an etch-back etching process to remove a desired amount of the insulating material from within the trenches until such time as only the desired amount of the insulating material remains positioned in the bottom of the trenches (hereinafter referred to as the "CMP/etch-back" process); 5) forming a) a layer of material for a sacrificial gate insulation layer, b) depositing a layer of material for a sacrificial gate electrode and c) depositing a layer of material for a gate cap layer; 6) patterning the layers referenced in steps 5a-c to define a sacrificial gate structure; 7) forming a silicon nitride sidewall spacer adjacent the sacrificial gate structure; 8) depositing a layer of insulating material on the device and performing a CMP process that stops on the gate cap layer; 9) performing a plurality of etching processes to remove the gate cap layer, the sacrificial gate electrode and the sacrificial gate insulation layer to thereby define a gate cavity that is laterally defined by the inner walls of the spacers; 10) depositing a final gate insulation layer and one or more metal layers in the gate cavity; and 11) performing a CMP process to remove excess portions of the final gate insulation layer and the various metal layers to thereby define the final gate structure for the FinFET device.

The above-described replacement gate technique, while effective, is not without its problems. First, the above-described process sequence is not readily transferable to FinFET devices when there is a desire to make another FinFET device to change the fin height, e.g., to change the fin height from 5 nm to 15 or 20 nm. That is, the etching processes that are performed to pattern the sacrificial gate insulation layer, the sacrificial gate electrode layer and the gate cap layer are, more or less, based upon the final desired fin height of the fins in the device. Thus, when exploring potential changes to product designs or actually implementing a change in the fin height on a production device, the patterning process performed on previously manufactured devices may not simply be used on the new devices, i.e., a new gate patterning process sequence may need to be tested and qualified for making the newly designed product, all at great time and expense. As another example, using the above-described process flow, the fins are more susceptible to damage because the patterning of the dummy gate polysilicon material is non-selective relative to the silicon fins and may result in damage to the fins if the hard mask used during the poly etching process is compromised.

The present disclosure is directed to various methods of forming 3-D semiconductor devices, such as FinFET devices, using a replacement gate technique, and to novel 3-D devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming 3-D semiconductor devices, such as FinFET devices, using a replacement gate technique, and to novel 3-D devices. In one example, the method disclosed herein includes forming a fin in a semiconducting substrate, forming a sacrificial gate structure above the fin, wherein the sacrificial gate structure is comprised of a sacrificial gate insulation layer, a layer of insulating material positioned above the sacrificial gate insulation layer, a sacrificial gate electrode layer positioned above the layer of insulating material and a gate cap layer positioned above the sacrificial gate electrode layer, forming a sidewall spacer adjacent opposite sides of the sacrificial gate structure, removing the sacrificial gate structure to thereby define a gate cavity that exposes a portion of the fin and forming a replacement gate structure in the gate cavity.

Another illustrative method disclosed herein includes forming a plurality of trenches in a semiconducting substrate to thereby define a fin, forming a local isolation region in the trenches, forming an etch stop layer on the isolation regions, forming a sacrificial gate insulation layer above the fin, forming a layer of insulating material above the sacrificial gate insulation layer, forming a sacrificial gate electrode layer above the layer of insulating material and forming a gate cap layer above the sacrificial gate electrode layer. In this embodiment, the method further includes performing at least one first etching process on the gate cap layer and the sacrificial gate electrode layer to define a patterned gate structure comprised of a portion of the gate cap layer and a portion of the sacrificial gate electrode layer, wherein the first etching process stops on the layer of insulating material and exposes portions of the layer of insulating material, performing at least one second etching process to remove the exposed portions of the layer of insulating material, wherein the second etching process stops on and exposes portions of the sacrificial gate insulation, performing at least one third etching process to remove the exposed portions of the gate insulation layer to thereby define a sacrificial gate structure comprised of a portion of the sacrificial gate insulation layer, a portion of the layer of insulating material, a portion of the sacrificial gate electrode layer and a portion of the gate cap layer, wherein the third etching process stops on the etch stop layer, forming a sidewall spacer adjacent opposite sides of the sacrificial gate structure, removing the sacrificial gate structure to thereby define a gate cavity that exposes a portion of the fin and forming a replacement gate structure in the gate cavity.

One illustrative device disclosed herein includes a semiconducting substrate comprising a plurality of fin structures that are separated by a trench formed in the substrate, a local isolation material positioned within the trench, a gate structure positioned around portions of the fin structures and above the local isolation material and an etch stop layer positioned between the gate structure and the local isolation material within the trench.

BRIEF DESCRIPTION OF THE DRAWINGS

The disclosure may be understood by reference to the following description taken in conjunction with the accompanying drawings, in which like reference numerals identify like elements, and in which.

Figure 1A:
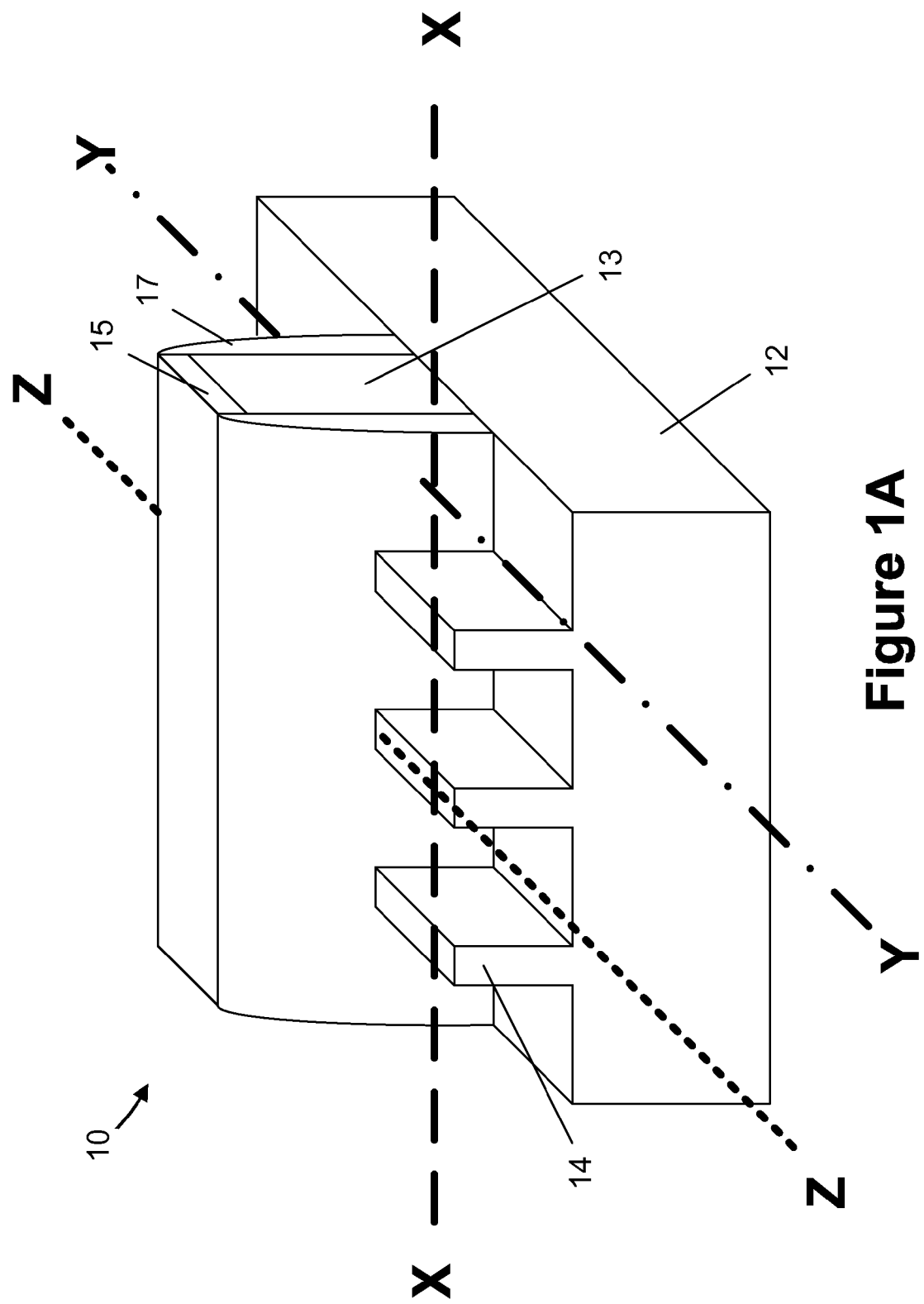
FIGS. 1A-1S depict one illustrative method disclosed herein for forming 3-D semiconductor devices, such as FinFET devices, using a replacement gate technique, and one illustrative embodiment of a novel 3-D device disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming 3-D semiconductor devices, such as FinFET devices, using a replacement gate technique, and to various novel 3-D devices. In the example described herein, the 3-D device is an illustrative FinFET device. However, after a complete reading of the present application, those skilled in the art will appreciate that the method disclosed herein may be employed on any type of 3-D device. Thus, the inventions disclosed herein should not be considered as being limited to any particular type of 3-D device. Moreover, as will be readily apparent to those skilled in the art upon a complete reading of the present application, the present method is applicable to a variety of devices, including, but not limited to, logic devices, memory devices, etc.

FIG. 1A is a perspective view of an illustrative FinFET semiconductor device 10 at an early stage of manufacturing that is formed above a semiconducting substrate 12. The substrate 12 may have a variety of configurations, such as the depicted bulk substrate configuration, or it may have a silicon-on-insulator (SOI) configuration. The substrate 12 may be made of silicon or it may be made of materials other than silicon. Thus, the terms "substrate" or "semiconducting substrate" should be understood to cover all semiconducting materials and all forms of such materials.

The illustrative device 10 includes a plurality of fins 14 that are defined in the substrate 12, a gate electrode 13, sidewall spacers 17 and a gate cap layer 15. FIG. 1A depicts the locations where various cross-sectional views of the device 10 will be taken in the drawings discussed below. More specifically, view "X-X" is a cross-sectional view taken through the fins 14 in a direction that is transverse to the long axis of the fins 14, view "Y-Y" is a cross-sectional view taken through the gate electrode 13 in the gate length direction, and view "Z-Z" is a cross-sectional view taken along the long axis of the fins 14. It should be understood that FIG. 1A is only provided to show the location of the various cross-sectional views depicted in the drawings below, and many aspects discussed below are not depicted in FIG. 1A so as to not overly complicate the device 10 depicted in FIG. 1A. Additionally, the reference numbers in used in FIG. 1A may not correspond to those used for similar structures depicted in the following drawings.

Figure 1B:
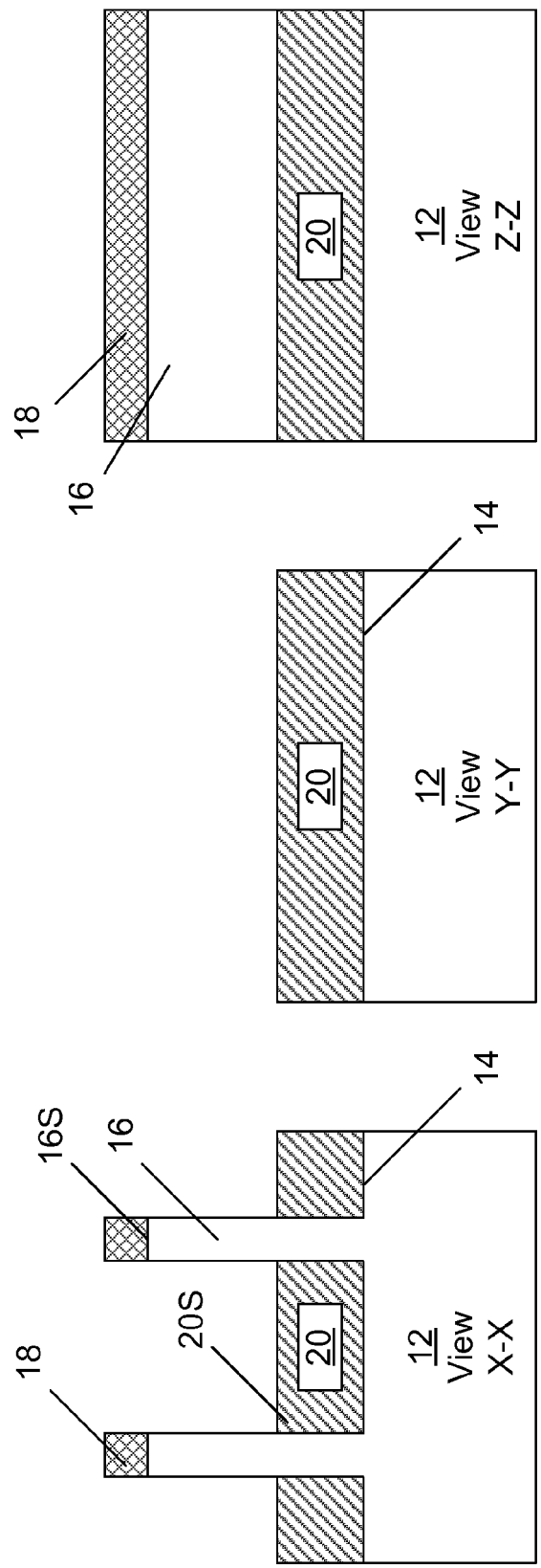

At the point of fabrication depicted in FIG. 1B, various process operations have been performed to define various structures for the device 10. More specifically, a plurality of fins 16 have been defined in the substrate 12 using a variety of known techniques. More specifically, in one illustrative process flow, an etching process, such as a dry or wet etching process, was performed on the substrate 12 through a patterned mask layer 18 to form a plurality of trenches 14 in the substrate 12 so as to thereby initially define the fins 16.

The overall size, shape, number and configuration of the trenches 14 and fins 16 may vary depending on the particular application. The depth and width of the trenches 14 may vary depending upon the particular application. In one illustrative embodiment, based on current day technology, the depth of the trenches 14 may range from approximately 50-300 nm and the width of the trenches 14 may range from about 10-50 nm. In some embodiments, the fins 16 may have a width within the range of about 5-30 nm. In the illustrative example depicted in the attached drawings, the trenches 14 and fins 16 are all of a uniform size and shape. However, as discussed more fully below, such uniformity in the size and shape of the trenches 14 and the fins 16 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14 and the fins 16, and the manner in which they are made, should not be considered a limitation of the present invention. For ease of disclosure, only the substantially rectangular trenches 14 and fins 16 will be depicted in subsequent drawings.

The patterned mask layer 18 is intended to be representative in nature as it may be comprised of a variety of materials, such as, for example, silicon nitride, silicon oxynitride, silicon dioxide, etc. Moreover, the patterned mask layer 18 may be comprised of multiple layers of material, such as, for example, a silicon nitride layer and a layer of silicon dioxide. The patterned mask layer 18 may be formed by forming or depositing the layer(s) of material that comprise the mask layer 18 and thereafter directly patterning the mask layer 18 using known photolithography and etching techniques. Alternatively, the patterned mask layer 18 may be formed by using known sidewall image transfer techniques. Thus, the particular form and composition of the patterned mask layer 18 and the manner in which it is made should not be considered a limitation of the present invention. In the case where the patterned mask layer 18 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

With continuing reference to FIG. 1B, a first layer of isolating insulating material 20, e.g., silicon dioxide, a flowable oxide, spin-on-glass (SOG), etc. is formed in the trenches 14 between the fins 16. The first layer of insulating material 20 will ultimately become local isolation regions for the device 10. The first layer of insulating material 20 should be formed of a material that will reliably form in the trenches 14 between adjacent fins 16. The first layer of insulating material 20 may be formed by performing a variety of techniques depending upon the selected material, e.g., by performing a spin-coating process, by performing a deposition process followed by performing an etch-back process, etc. In one illustrative embodiment, the upper surface 20S of the first layer of insulating material 20 may be about 10-50 nm below the upper surface 16S of the fins 16. In one illustrative embodiment, the first layer of insulating material 20 may be a flowable oxide material that is formed by performing either a CVD process or a spin-coating process followed by performing a curing process.

Figure 1C:
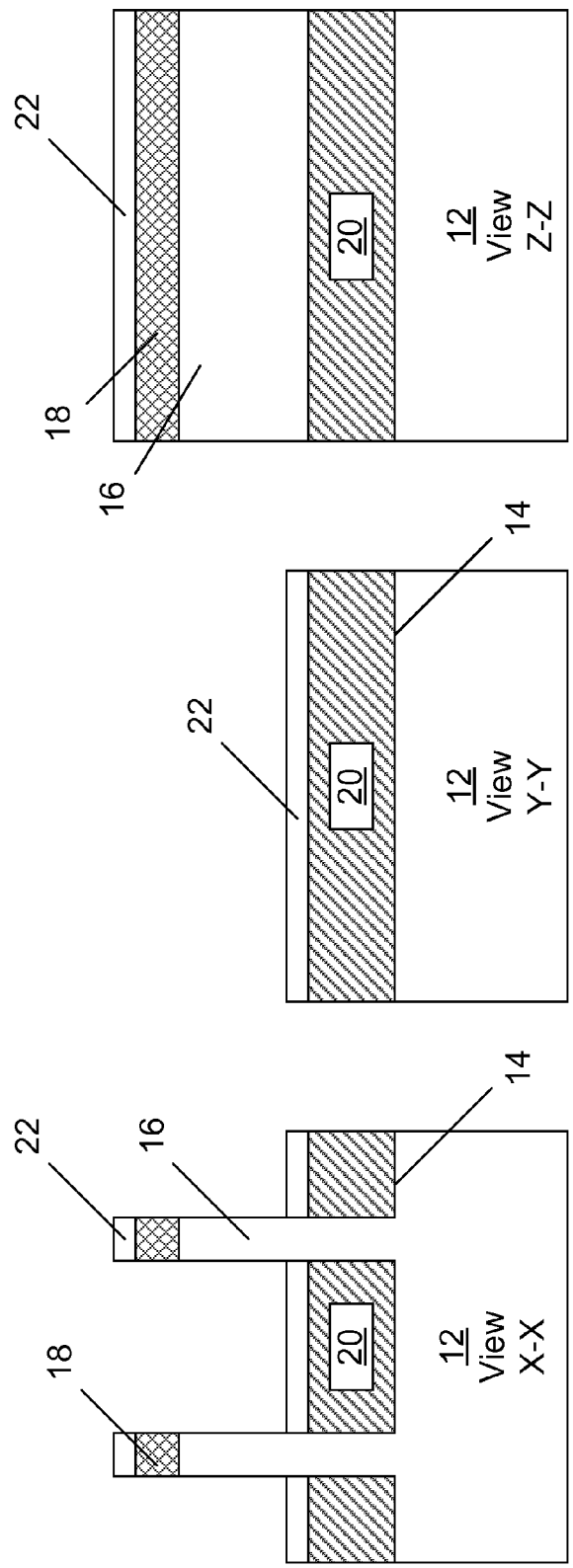

Next, as shown in FIG. 1C, a gas cluster ion beam (GCIB) process is performed to form an etch stop layer 22 above the first layer of insulating material 20 and above the patterned mask layer 18. In general, the GCIB process results in the formation of material 22 on the substantially horizontally oriented surfaces, such as above the patterned mask layer 18, without forming appreciable amounts of the material 22 on vertically oriented surfaces. The etch stop layer 22 may be comprised of a variety of different materials, e.g., silicon nitride, etc., and its thickness may vary depending upon the particular application. In one illustrative embodiment, the etch stop layer 22 may be a layer of silicon nitride with a thickness that falls within the range of about 1-3 nm.

Figure 1D:
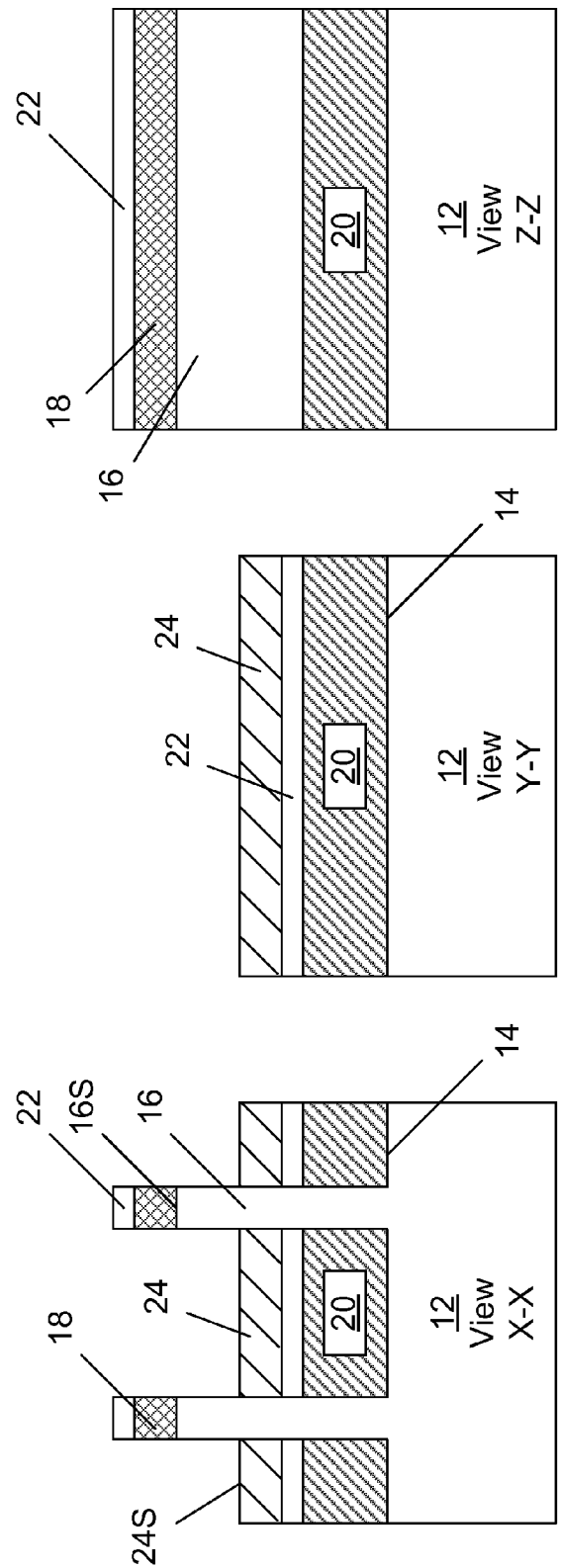

Next, as shown in FIG. 1D, a second layer of insulating material 24 is formed above the etch stop layer 22. The second layer of insulating material 24 may be comprised of a variety of materials, such as a layer of high density plasma (HDP) silicon dioxide, a flowable oxide, a HARP oxide, an e-HARP oxide, etc. The second layer of insulating material 24 may be formed by performing a variety of techniques depending upon the selected material, e.g., a spin-coating process, a deposition process followed by an etch-back process, etc. In one illustrative embodiment, the upper surface 24S of the second layer of insulating material 24 may be about 1-2 nm below the upper surface 16S of the fins 16, although this spacing dimension is not critical. In one illustrative embodiment, the second layer of insulating material 24 may be a flowable oxide material, and it may be formed by performing a spin-coating process followed by performing a curing process. In one particular example, the second layer of insulating material 24 may be a carbon-doped oxide which provides very good wet etch resistance to an etching process that will be performed to strip the patterned hard mask 18, as described below. In cases where the second layer of insulating material 24 is doped with carbon, it may have a carbon concentration of about 2-20%.

Figure 1E:
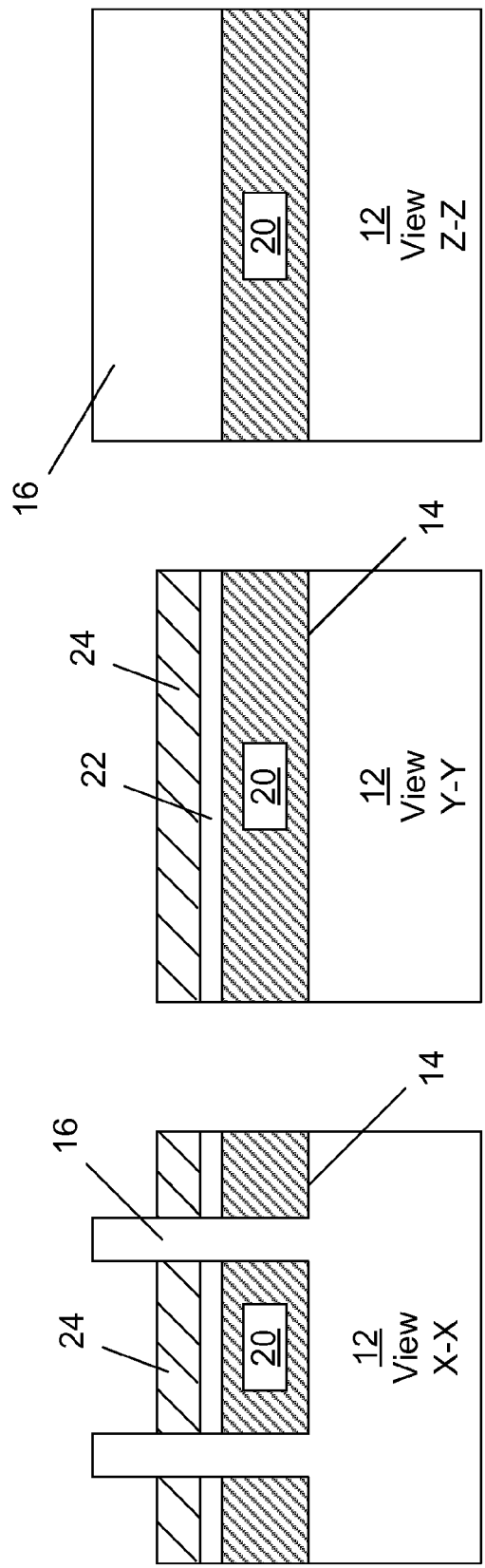

FIG. 1E depicts the device 10 after one or more etching processes have been performed to strip the patterned hard mask 18 and to clear the fins 16 of undesirable materials. In the illustrative example, where the patterned hard mask layer 18 is made of silicon nitride, a wet etching process may be performed using hot phosphoric acid or HF to remove the patterned hard mask 18. This etching process stops on the second layer of insulating material 24.

Figure 1F:
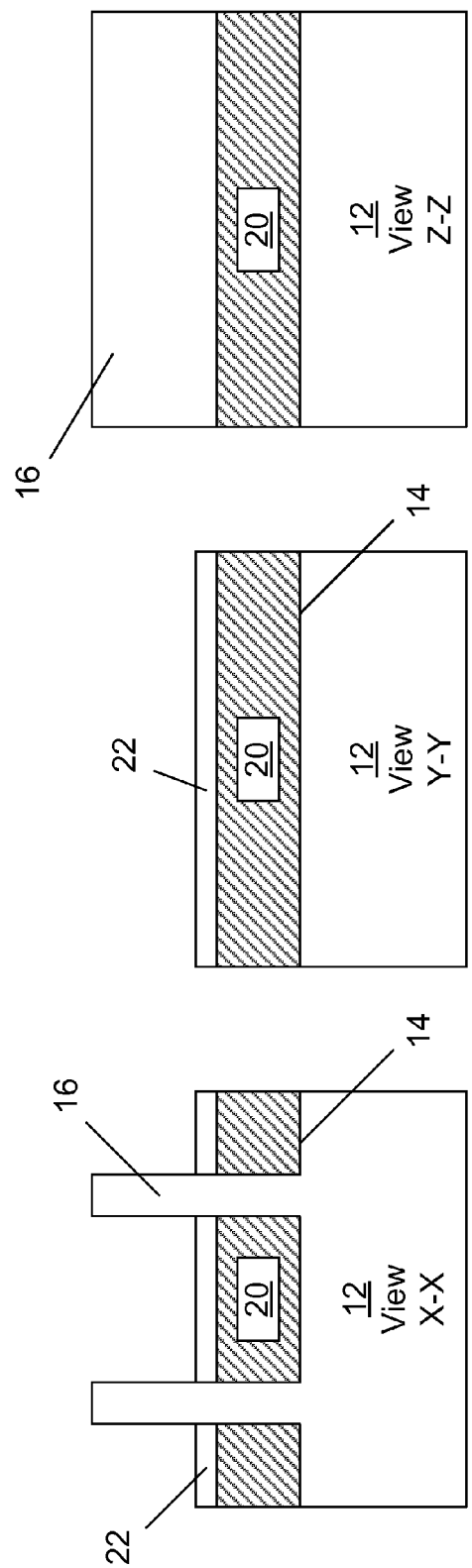

Next, as shown in FIG. 1F, one or more etching processes are performed to remove the second layer of insulating material 24 from above the etch stop layer 22. In the case where the second layer of insulating material 24 is a carbon-doped layer of material, it will tend to etch at a much faster rate after being exposed to UV treatment or to a plasma process to remove carbon from the film and, thus, it may be more easily removed with, for example, a dilute HF acid as compared to a thermal oxide material.

Thereafter, as shown in FIG. 1G, a sacrificial gate insulation layer 26 is conformably deposited on the device 10. The sacrificial gate insulation layer 26 may be comprised of a variety of materials, such as silicon dioxide, silicon oxynitride, etc. The sacrificial gate insulation layer 26 may be formed by performing a variety of techniques depending upon the selected material, e.g., a conformal CVD process, and it may have a thickness within the range of about 3-6 nm.

Figure 1H:
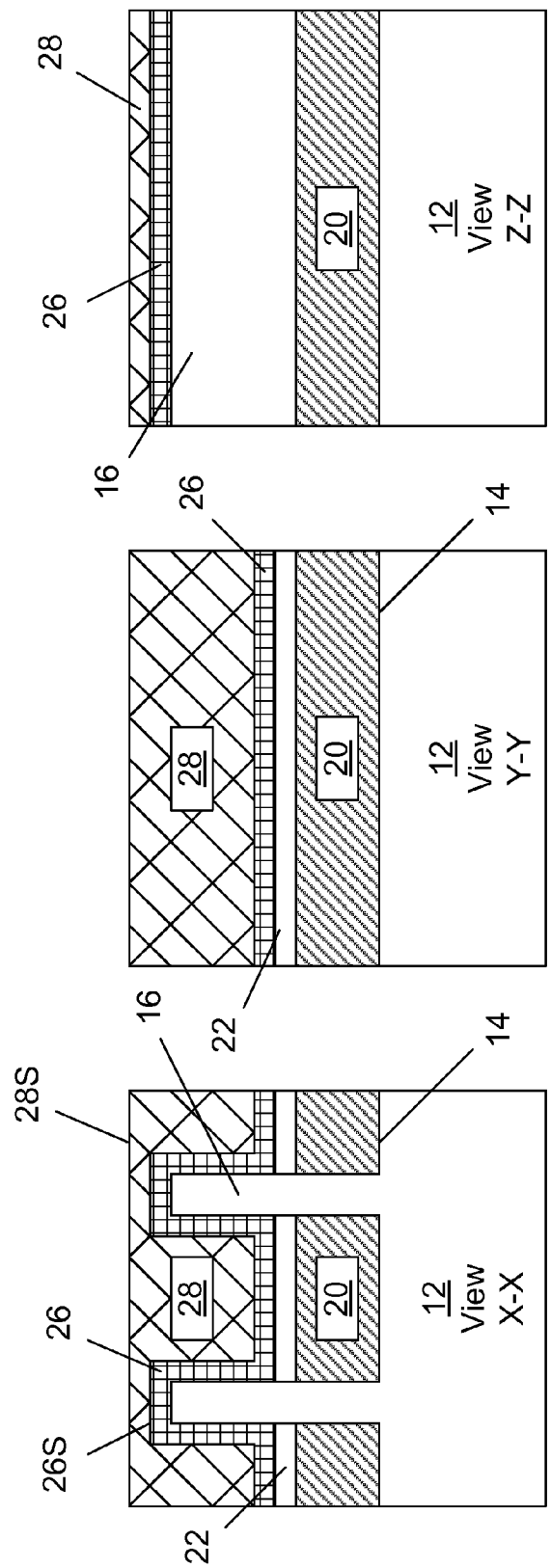

FIG. 1H depicts the device 10 after several process operations have been performed. First, a third layer of insulating material 28 was formed on the device 10. The third layer of insulating material 28 may be comprised of a variety of flowable oxide materials, such as a layer of a flowable undoped oxide, a carbon-doped flowable oxide, etc. The third layer of insulating material 28 may be formed by performing a variety of techniques depending upon the selected material, e.g., a spin-coating process, a deposition process. Thereafter, a chemical mechanical polishing (CMP) process was performed to planarize the upper surface 28S of the third layer of insulating material 28 such that the upper surface 28S of the third layer of insulating material 28 is positioned above the upper surface 26S of the sacrificial gate insulation layer 26 by a distance of about 1-3 nm. In one illustrative embodiment, the third layer of insulating material 28 may be a carbon-doped flowable oxide material that is formed by performing a spin-coating process followed by performing a curing process.

Figure 1I:
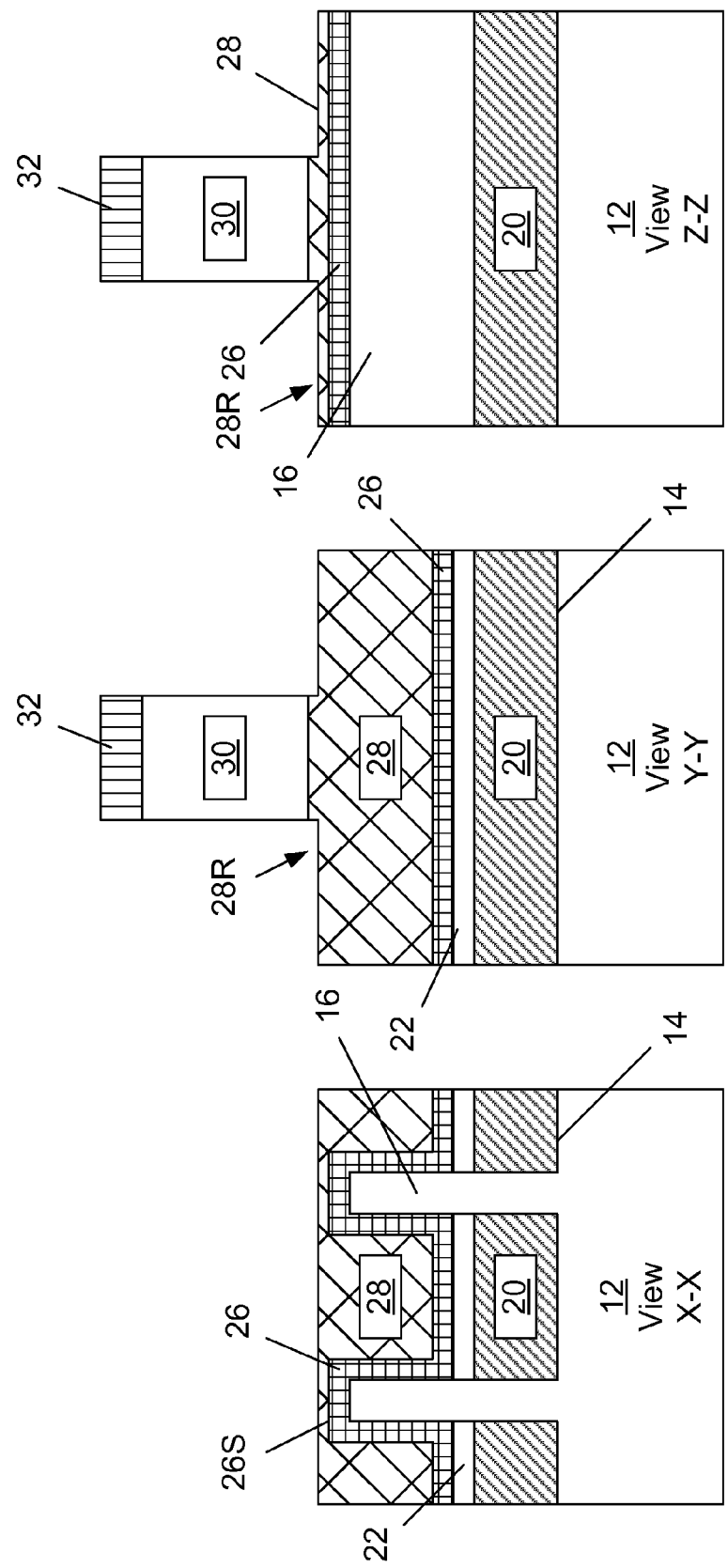

FIG. 1I depicts the device 10 after several process operations have been performed. This portion of the process begins with the formation of several layers of material on the device 10: a sacrificial gate electrode layer 30 and a gate cap layer 32. Such layers may be formed using a variety of different materials and by performing a variety of known techniques. For example, the sacrificial gate electrode layer 30 may be comprised of polysilicon or amorphous silicon and the gate cap layer 32 may be comprised of silicon nitride. The sacrificial gate electrode layer 30 and the gate cap layer 32 may be of any desired thickness. Moreover, the gate cap layer 32 may be comprised of multiple layers of material, such as, for example, a combination of a silicon nitride layer and a layer of silicon dioxide. Thus, the particular form and composition of the gate cap layer 32 and the manner in which it is made should not be considered a limitation of the present invention. The layers of material 30, 32 depicted in FIG. 1I may be formed by any of a variety of different known techniques, e.g., chemical vapor deposition (CVD) processes, atomic layer deposition (ALD) processes, etc.

With continuing reference to FIG. 1I, one or more patterning and etching processes are performed on the layers of material 30, 32 to define a patterned gate structure comprised of a portion of the sacrificial gate electrode layer 30 and a portion of the gate cap layer 32. Typically, the gate cap layer 32 is patterned using known photolithography and etching techniques to thereby define the patterned gate cap layer 32. Alternatively, the gate cap layer 32 may be patterned using known sidewall image transfer techniques. Thereafter, one or more etching processes are performed through the patterned gate cap layer 32 to remove exposed portions of the sacrificial gate electrode layer 30 to thereby define the depicted sacrificial gate electrode 30. During the etching processes performed to define the gate electrode 30, portions of the third layer of insulating material 28 may be consumed, as reflected by the recesses 28R.

Figure 1J:
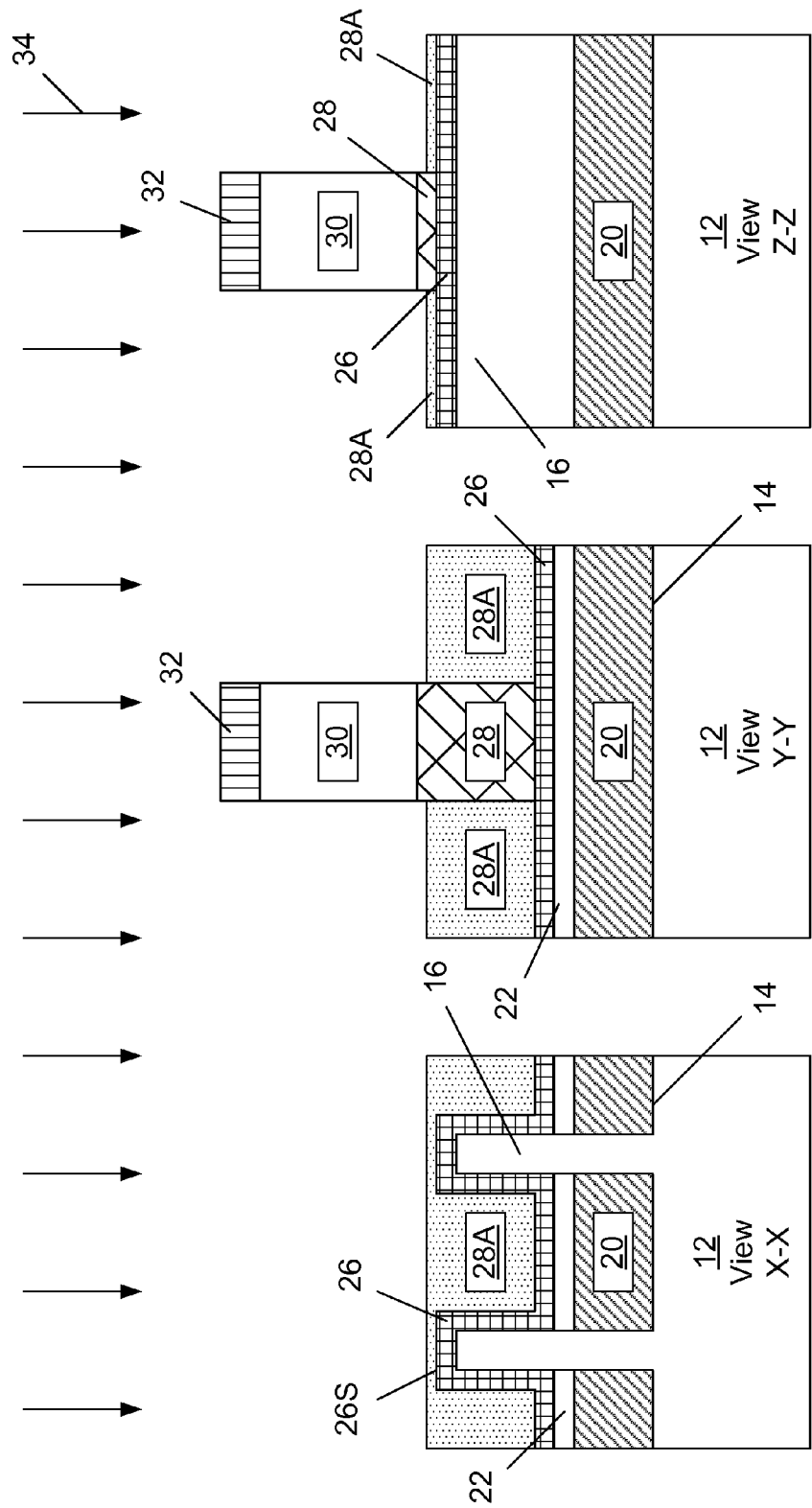

Next, as shown in FIG. 1J, a process operation 34 is performed on the exposed portions of the third layer of insulating material 28 to form treated material regions 28A that have etching characteristics that are different than those of the original third layer of insulating material 28. More specifically, the process operation 34 tends to remove carbon from the exposed portions of the third layer of insulating material 28 which will make the treated regions 28A and the original material 28 have significantly different etch characteristics, e.g., significantly different etch rates. As an example, where the third layer of insulating material 28 is a flowable oxide material, the process operation 34 may be a UV cure process or a plasma treatment process to remove carbon from the third layer of insulating material 28. After the process operation 34 is performed, the treated regions 28A may be more easily removed relative to the original, un-treated regions 28, as the treated regions 28A tend to be more porous, e.g., there may be an etch selectivity of about 1000:1 in a dilute HF acid etching process between the two regions.

Figure 1K:
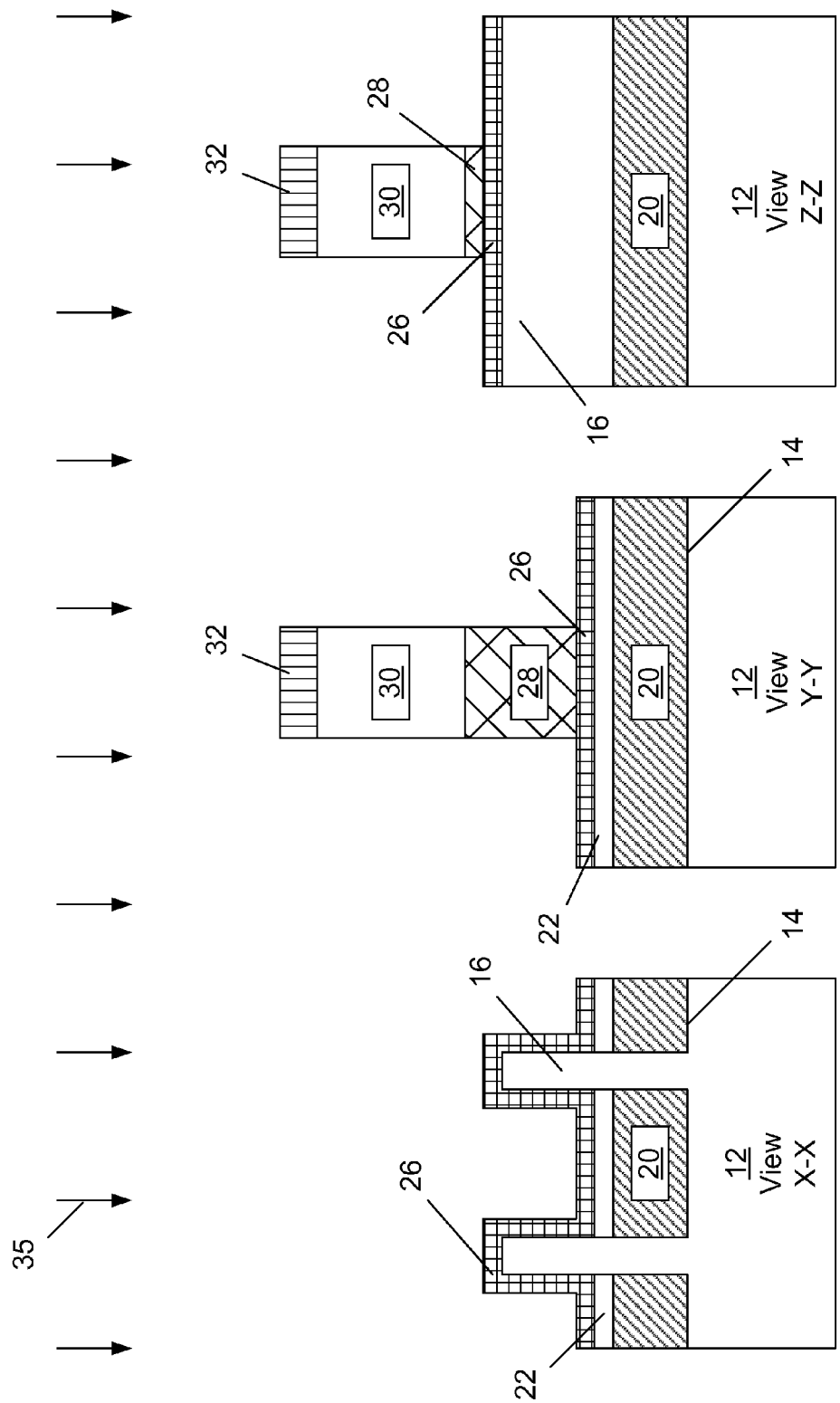

FIG. 1K depicts the device 10 after one or more etching processes 35 have been performed to remove the treated regions 28A of the third layer of insulating material 28. The etching process 35 stops on the sacrificial gate insulation layer 26. The etching process(es) 35 may be performed using wet or dry etching processes. In the case where a wet etching process, such as a dilute HF acid etching process, is performed, the treated regions 28A will etch at a much faster rate than that of the untreated regions 28 of the third layer of insulating material 28. In the case where a dry, reactive ion etching process is performed, the porous nature of the treated regions 28A makes it easier to remove relative to the untreated regions 28.

Figure 1L:
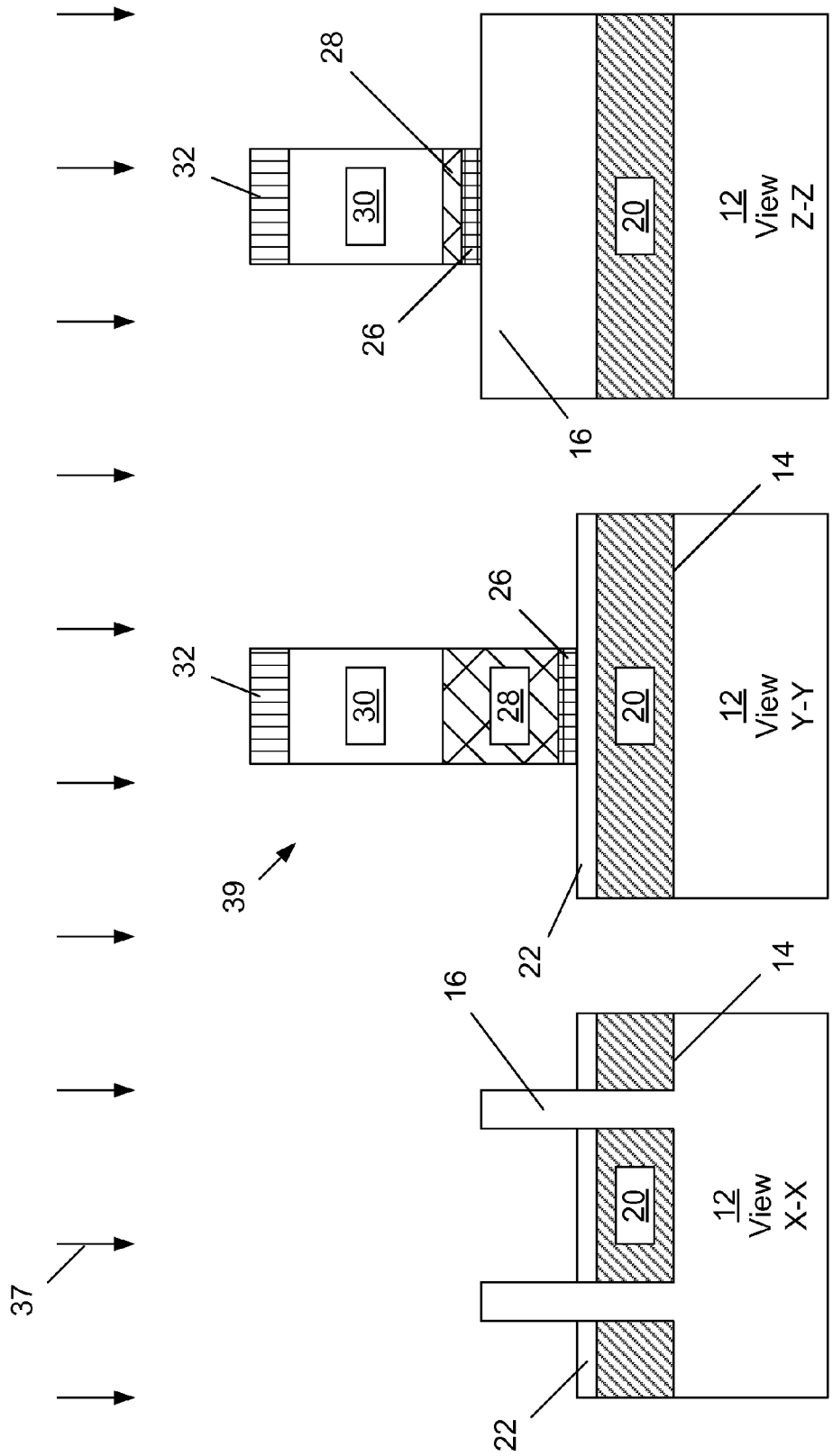

The exposed portions of the sacrificial gate insulation layer 26 depicted in FIG. 1K will ultimately be removed prior to forming epi material on the fins 16. In one case, the exposed portions of the sacrificial gate insulation layer 26 may be removed by extending or continuing the etch process performed to remove the treated regions 28A of the third layer of insulating material 28, as described above in connection with FIG. 1K. In another embodiment, the exposed portions of the sacrificial gate insulation layer 26 may be removed as part of an epi pre-clean process that is performed on the fins 16 prior to the growth of epitaxially formed semiconductor material on the fins 16. FIG. 1L depicts yet another alternative wherein one or more etching processes 37 have been performed for the express purpose of removing the exposed portions of the sacrificial gate insulation layer 26. The etching process(es) 37 stop on the fins 16 and the etch stop layer 22 and result in the fins 16 being cleared of material and portions of the sacrificial gate insulation layer 26 being positioned under the sacrificial gate electrode 30.

The etching process(es) 37 may be performed using wet or dry etching processes that use the same etch chemistry or by using a different etch chemistry than that employed in the etching process(es) 35. In one embodiment, the etching processes 35, 37 may be one single etching sequence in which etch chemistries may or may not be changed.

Irrespective of how the exposed portions of the sacrificial gate insulation layer 26 are removed, the methods disclosed herein result in the formation of a novel sacrificial gate structure 39 comprised of the sacrificial gate insulation layer 26, the layer of insulating material 28, the sacrificial gate electrode 30 and the gate cap layer 32.

Figure 1M:
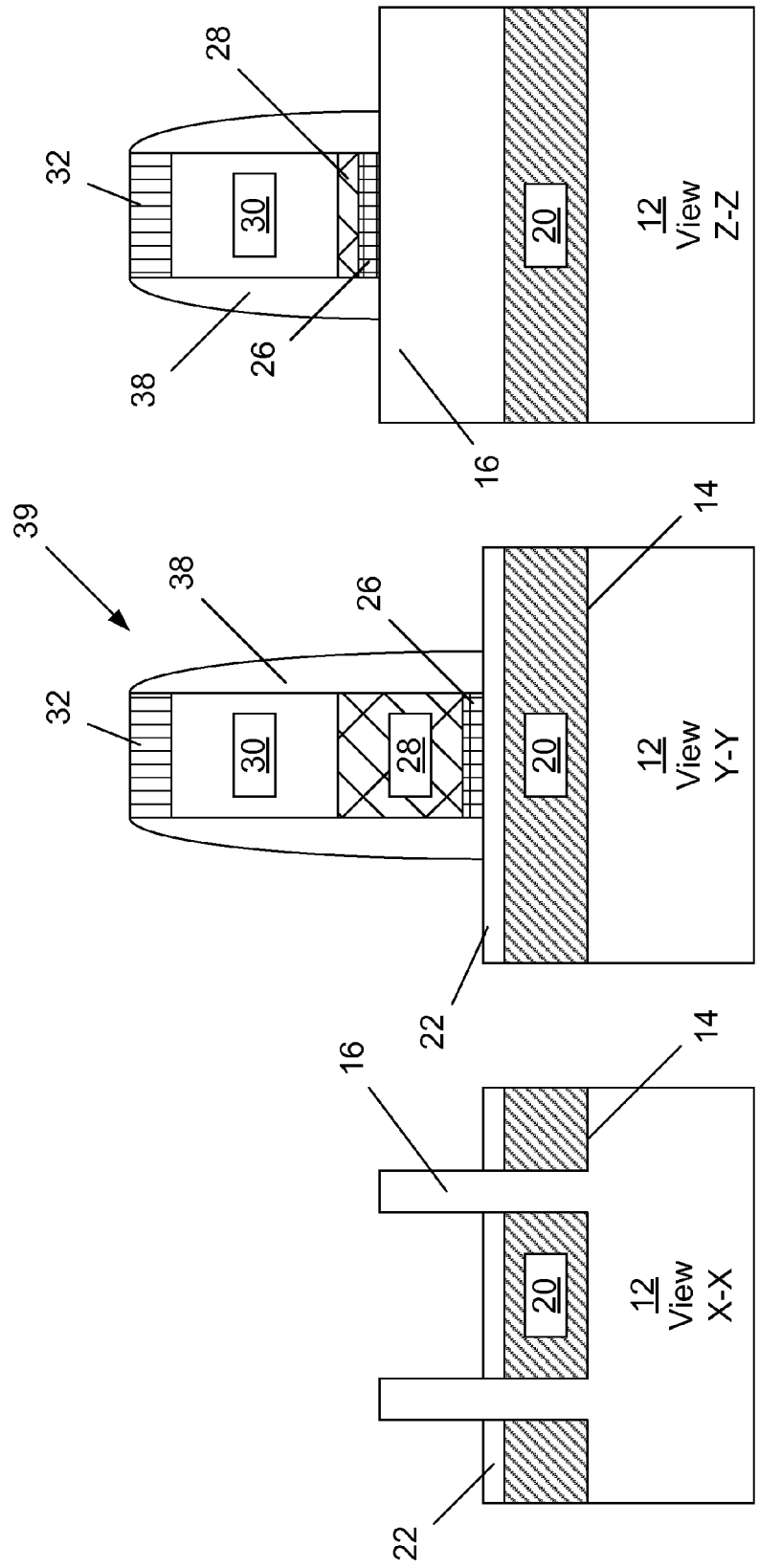

Next, as shown in FIG. 1M, a sidewall spacer 38 is formed adjacent the sacrificial gate structure 39. The spacer 38 may be formed by conformably depositing a layer of spacer material and thereafter performing an anisotropic etching process to define the sidewall spacer 38. The spacer 38 may be comprised of a variety of different materials, such as silicon nitride, silicon carbon nitride (SiCN), etc. The spacer 38 may have a base thickness of about 5-20 nm. Within the trenches 14, the sidewall spacer 38 does not form to any appreciable extent due to the relatively short height of the fins 16 and the duration of the anisotropic etching process.

Figure 1N:
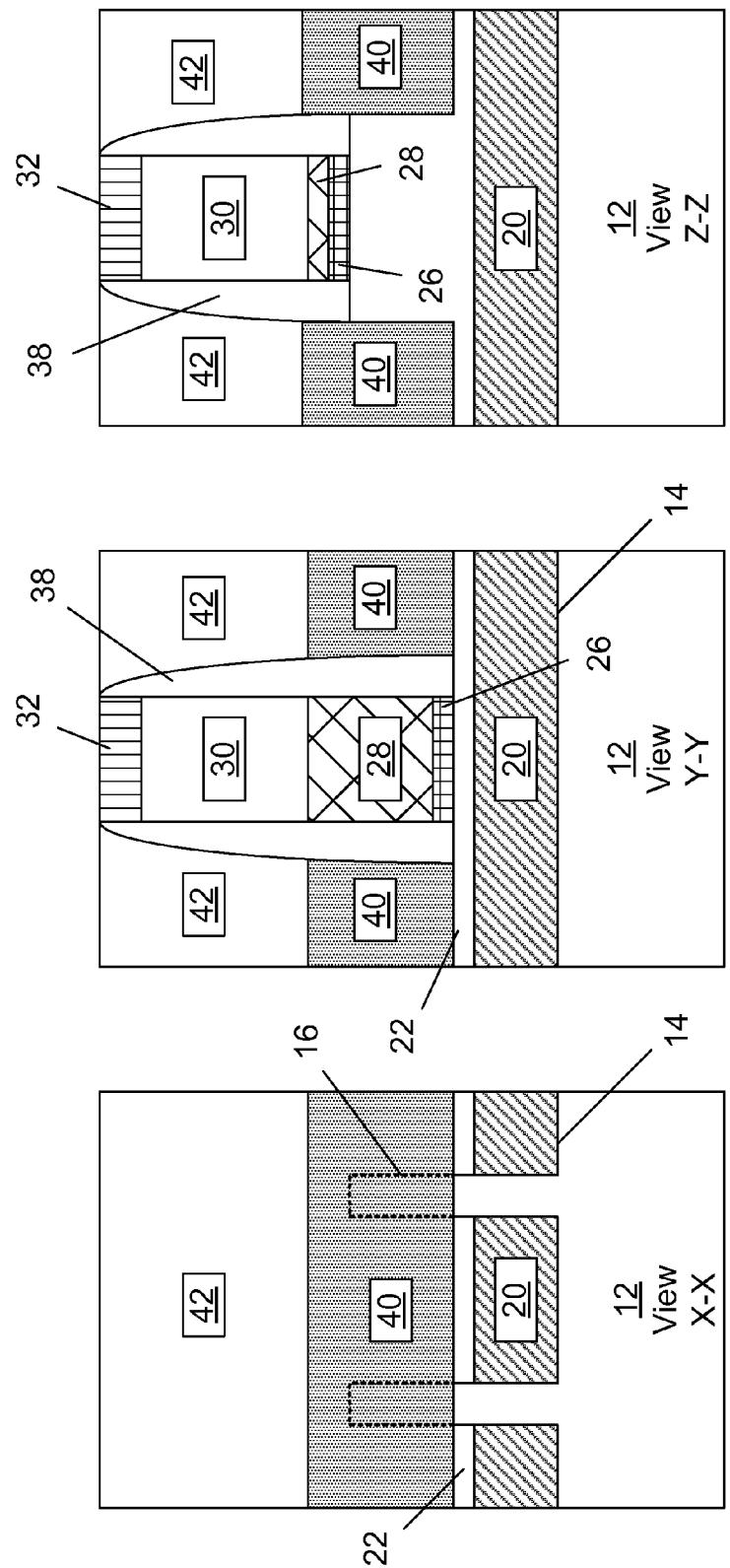
Figure 10:
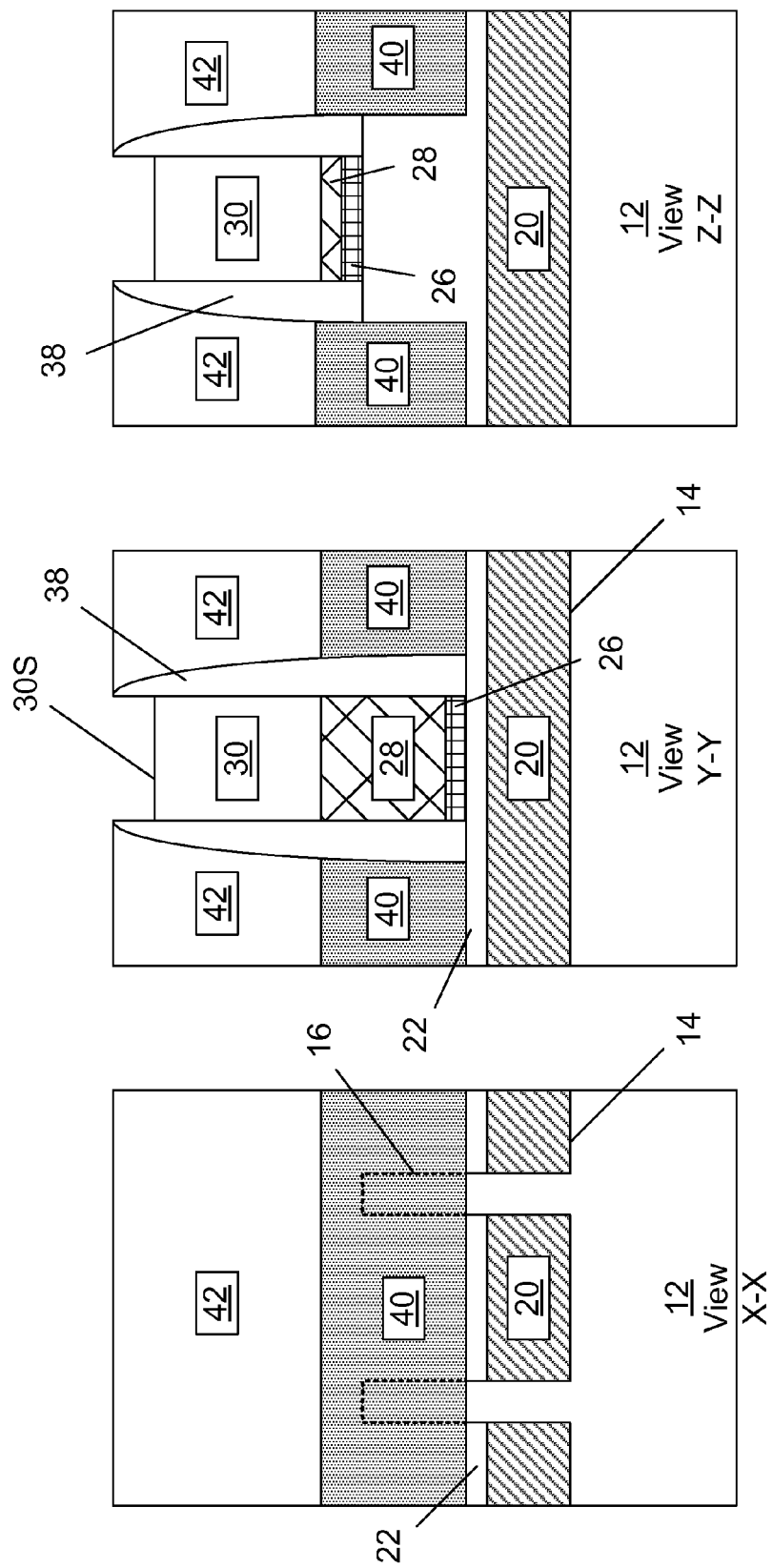

FIG. 1N depicts the device 10 after several process operations have been performed. First, an epi deposition process was performed to form a semiconductor material 40 on the fins 16, i.e., this process is sometimes referred to as "merging" the fins 16 together. However, this fin merger process is optional in nature and not required to practice the novel inventions disclosed herein. A dashed line 16 in view "X-X" depicts an outline of the original rectangular-shaped fins 16. Although not depicted in the drawings, in some cases, an epitaxially grown semiconductor material (not shown) having a diamond-like configuration may be formed on the fins 16 prior to performing the fin merger process.

Also depicted in FIG. 1N, a fourth layer of insulating material 42 has been formed on the device 10. The layer of material 42 may be comprised of a variety of different materials, such as silicon dioxide, etc., and it may be formed by performing a variety of techniques, e.g., chemical vapor deposition (CVD), etc. Thereafter, a chemical mechanical polishing (CMP) process was performed to planarize the upper surface of the layer of material 42 using the gate cap layer 32 as a polish stop layer. The CMP process exposes the upper surface of the gate cap layer 32 for further processing.

FIG. 1O depicts the device 10 after an etching process was performed to remove the exposed gate cap layer 32 selectively relative to the layer of material 42 and the sacrificial gate electrode 30. The removal of the gate cap layer 32 exposes the upper surface 30S of the sacrificial gate electrode 30 for further processing.

Figure 1P:
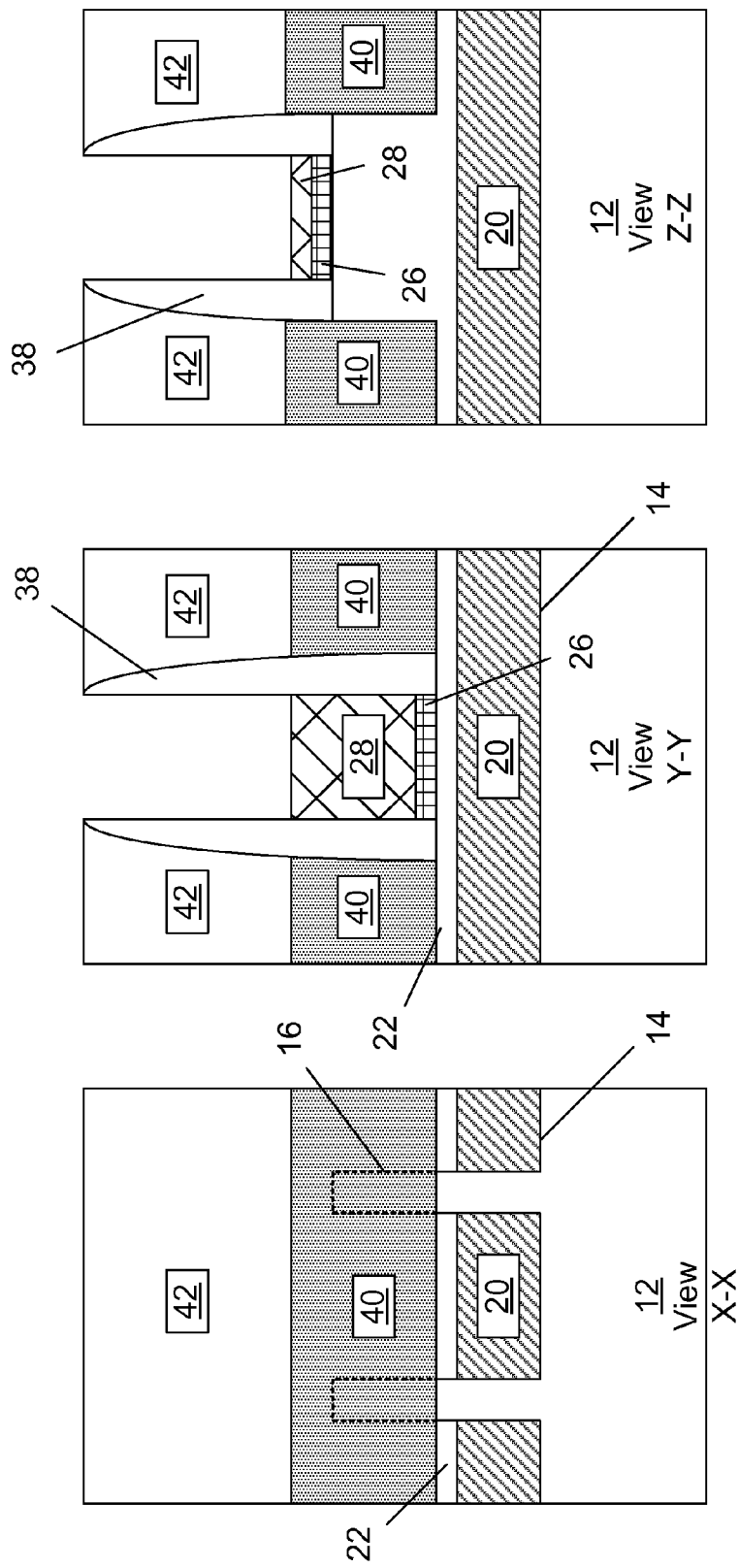

FIG. 1P depicts the device 10 after one or more etching processes have been performed to remove the sacrificial gate electrode 30 selectively relative to the remaining untreated portions of the third layer of insulating material 28. This etching process exposes the remaining untreated portions of the layer of insulting material 28 for further processing.

Figure 1Q:
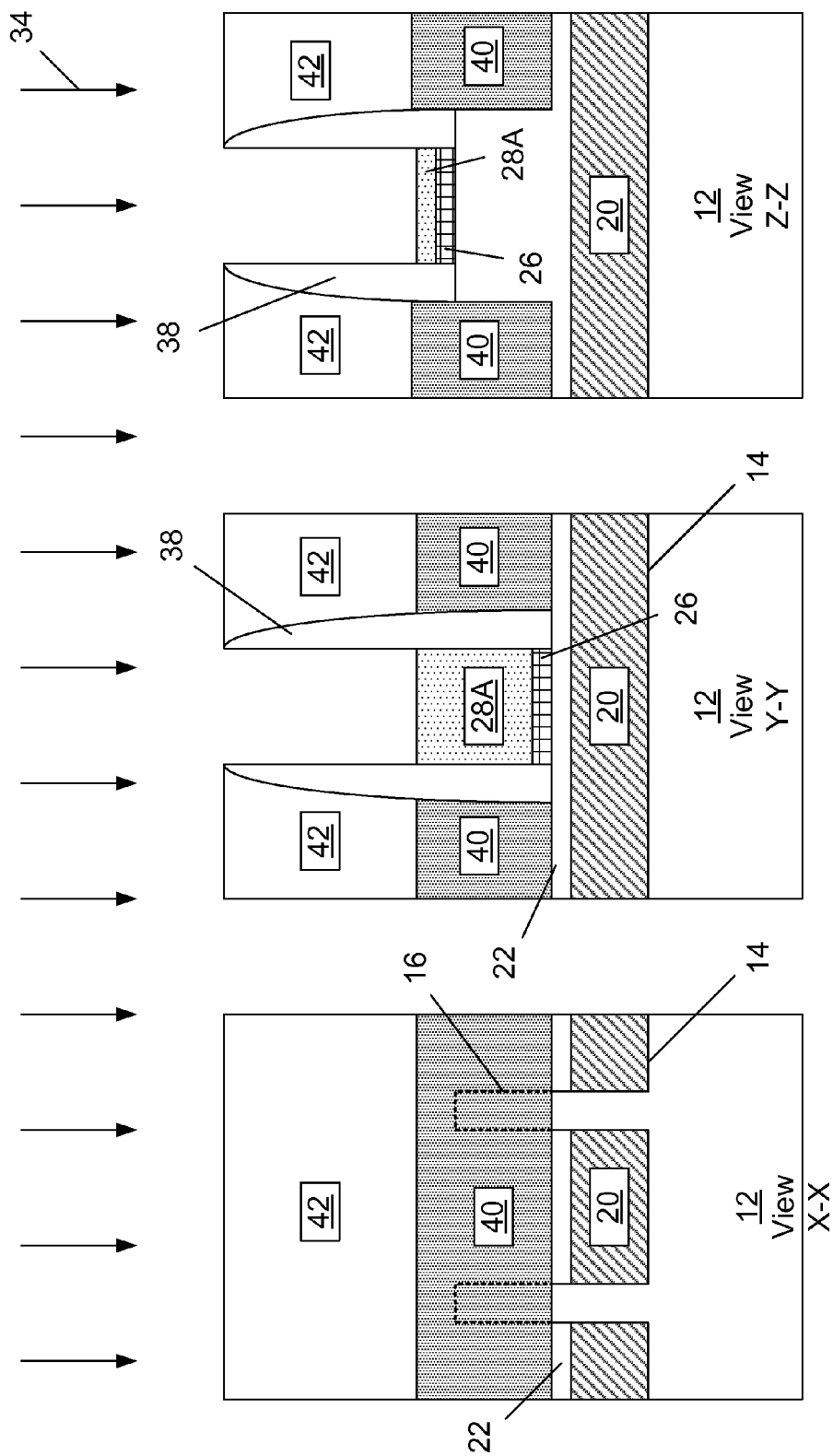

FIG. 1Q depicts the device 10 after the previously described process operation 34 has been performed on the exposed untreated portions of the third layer of insulating material 28 to thereby form treated material regions 28A that have etching characteristics that are different than those of the original third layer of insulating material 28, as described above.

Figure 1R:
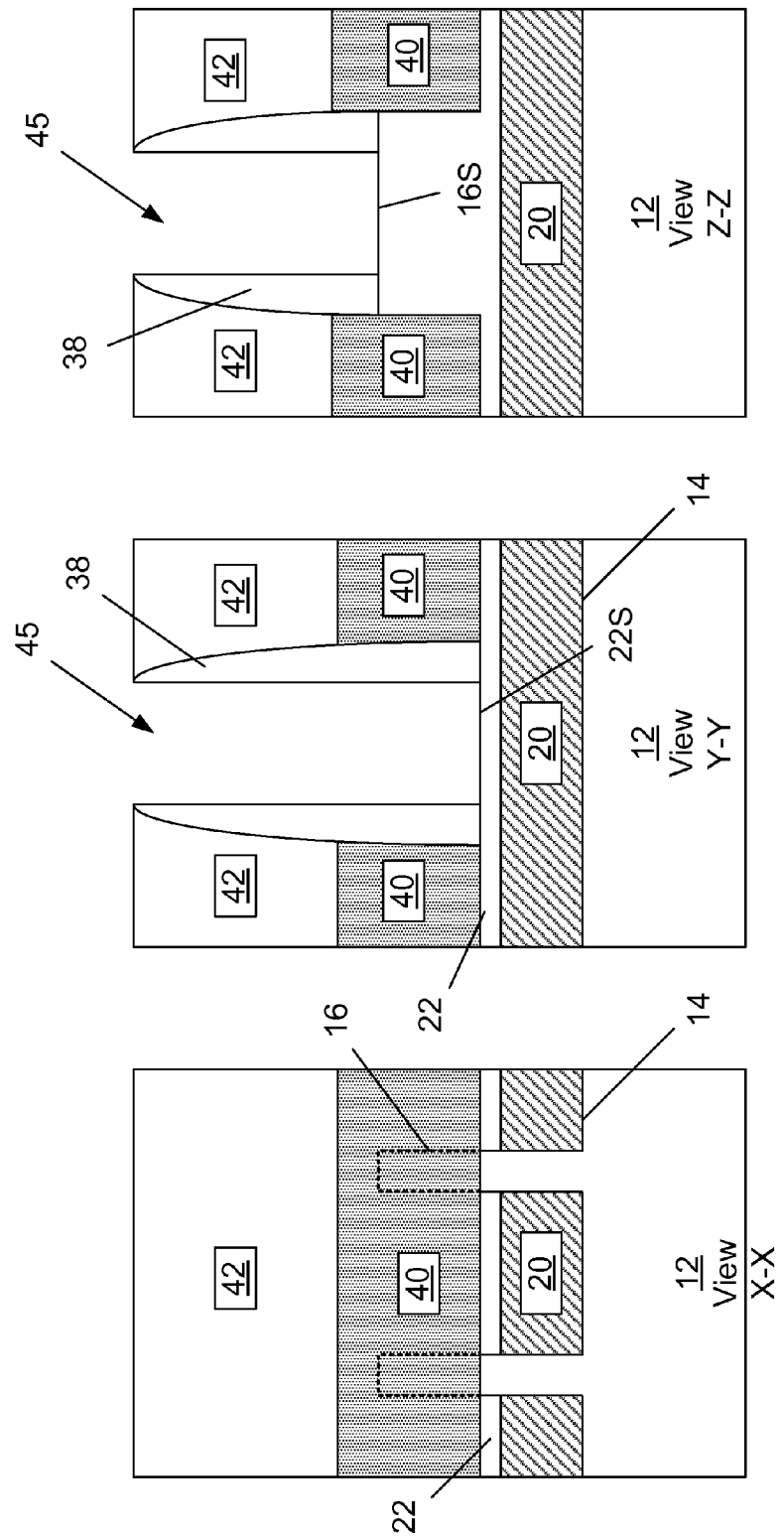

FIG. 1R depicts the device 10 after the previously described etching processes 35, 37 have been performed to remove the treated regions 28A and the sacrificial gate insulation layer 26. These process operations result in the definition of a gate cavity 45 that is defined laterally by the spacers 38. As shown in view "Y-Y," this process stops on the surface 22S of the etch stop layer 22. The presence of the etch stop layer 22 during the removal of the sacrificial gate insulation layer 26 insures that the etching process performed to remove the sacrificial gate insulation layer 26 can be performed for a sufficient duration to insure complete removal of the sacrificial gate insulation layer 26 from the fins 16 without fear of consuming portions of the layer of insulating material 20, i.e., the local isolation regions for the device.

Figure 1S:
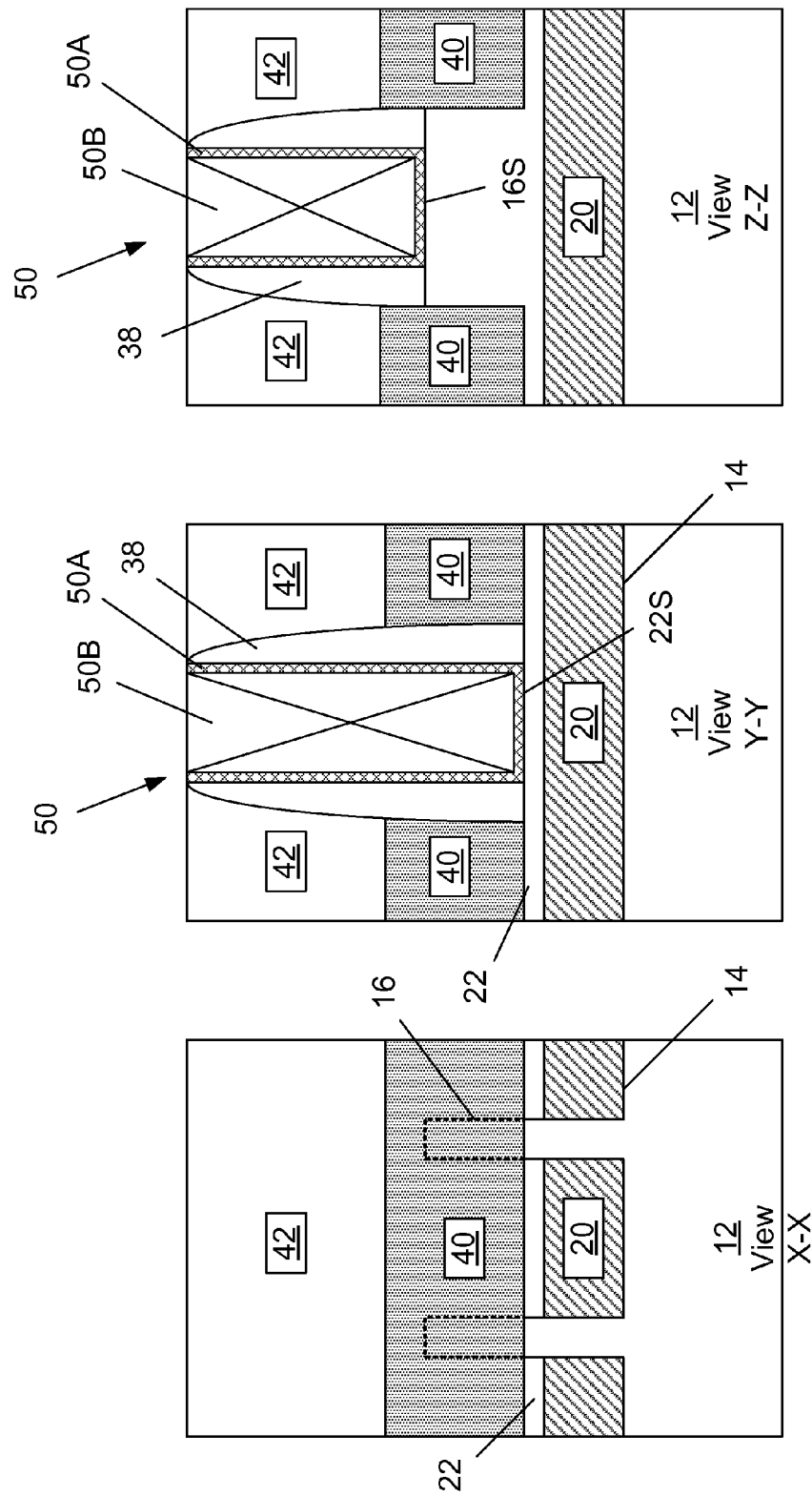

At this point in the process flow, as shown in FIG. 1S, a final gate structure 50 for the device 10 is formed within the gate cavity 45. More specifically, a final gate insulation layer 50A may be formed on the fins 16 within the gate cavity 45 by performing, for example, a conformal CVD process. The final gate insulation layer 50A may be comprised of a variety of different materials, such as, for example, a so-called high-k (k greater than 10) insulation material (where k is the relative dielectric constant), etc. The thickness of the gate insulation layer 50A may also vary depending upon the particular application, e.g., it may have a thickness of about 2-5 nm. The final gate electrode 50B may also be of one or more metal layers, e.g., TiN, TaN, W, Al, etc., that act as the gate electrode 50B. As will be recognized by those skilled in the art after a complete reading of the present application, the final gate structure 50 of the device 10 depicted in the drawings, i.e., the gate insulation layer 50A and the gate electrode 50B, is intended to be representative in nature. In one illustrative embodiment, a conformal CVD process may be performed to form a gate insulation layer 50A comprised of hafnium oxide in the gate cavity 45. Thereafter, one or more metal layers (that will become the gate electrode 50B) may be deposited above the device 10 and in the cavity 45. Thereafter, one or more CMP processes may be performed to remove excess portions of the gate insulation layer 50A and the materials that comprise the gate electrode 50B that are positioned outside of the gate cavity 45 and above the layer of material 42. The aforementioned process operations result in the structure depicted in FIG. 1S. If desired, a capping layer (not shown), such as a layer of silicon nitride, may be formed above the structure depicted in FIG. 1S to protect the final gate structure 50 from further process operations. At this point, traditional manufacturing techniques may be performed to complete the manufacture of the device 10, e.g., the formation of various conductive contact structures (not shown) to various regions of the device 10, etc.

The methods disclosed herein result in the formation of a device 10 with various novel features. With reference to FIG. 1S, view "Y-Y," the novel device 10 disclosed herein includes the novel etch stop layer 22 positioned under the final gate structure 50 and under the merged source/drain regions 40. Even more specifically, in the depicted example, within the trenches 14, the etch stop layer 22 is formed on the local isolation material 20 positioned between adjacent fins 16. As an even more general statement, the novel device 10 disclosed herein includes a semiconducting substrate 12 comprised of a plurality of fin structures 16 that are separated by a trench 14 formed in the substrate 12, a local isolation material 20 positioned within the trench 14, a gate structure 50 positioned around portions of the fin structures 16 and above the local isolation material 20 and an etch stop layer 22 positioned between the gate structure 50 and the local isolation material 20 within the trench 14. In more detailed embodiments, the merged source/drain regions 40 are positioned above the etch stop layer 22 within the trench 14.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a fin in a semiconducting substrate, the fin having an upper surface and sidewalls;
   forming a sacrificial gate structure above said fin, said sacrificial gate structure comprising a sacrificial gate insulation layer positioned on the upper surface and at least a portion of the sidewall so said fin, a layer of insulating material positioned above said sacrificial gate insulation layer, a sacrificial gate electrode layer positioned above said layer of insulating material and a gate cap layer positioned above said sacrificial gate electrode layer;
   forming a sidewall spacer adjacent opposite sides of said sacrificial gate structure;
   removing an entirety of said sacrificial gate structure to thereby define a gate cavity that exposes a portion of said fin, wherein said gate cavity is laterally defined by said spacers; and
   forming a replacement gate structure in said gate cavity.

2. The method of claim 1, wherein said semiconducting material is comprised of silicon.

3. The method of claim 1, wherein said sacrificial gate insulation layer is comprised of a silicon dioxide, said layer of insulating material is comprised of a flowable oxide material, said sacrificial gate electrode layer is comprised of polysilicon and said gate cap layer is comprised of silicon nitride.

4. The method of claim 1, wherein said replacement gate structure comprises a gate insulation layer comprised of a high-k insulating material and a gate electrode comprised of at least one layer of metal.

5. The method of claim 1, wherein forming said sacrificial gate structure above said fin comprises:
   forming said sacrificial gate insulation layer on the upper surface and a portion of the sidewalls of said fin;
   forming said layer of insulating material on said sacrificial gate insulation layer;
   forming said sacrificial gate electrode layer on said layer of insulating material; and
   forming said gate cap layer on said sacrificial gate electrode layer.

6. A method of forming a FinFET device, comprising:
   forming a plurality of trenches in a semiconducting substrate to thereby define a fin;
   forming a local isolation region comprised of an isolating insulating material in said trenches;
   forming an etch stop layer on said isolation regions;
   forming a sacrificial gate insulation layer above said fin;
   forming a layer of insulating material above said sacrificial gate insulation layer;
   forming a sacrificial gate electrode layer above said layer of insulating material;
   forming a gate cap layer above said sacrificial gate electrode layer;
   performing at least one first etching process on said gate cap layer and said sacrificial gate electrode layer to define a patterned gate structure comprised of a portion of said gate cap layer and a portion of said sacrificial gate electrode layer, wherein said at least one first etching process stops on said layer of insulating material and exposes portions of said layer of insulating material;
   performing at least one second etching process to remove said exposed portions of said layer of insulating material, wherein said at least one second etching process stops on and exposes portions of said sacrificial gate insulation;

performing at least one third etching process to remove said exposed portions of said gate insulation layer to thereby define a sacrificial gate structure comprised of a portion of said sacrificial gate insulation layer, a portion of said layer of insulating material, said portion of said sacrificial gate electrode layer and said portion of said gate cap layer, wherein said at least one third etching process stops on said etch stop layer;

forming a sidewall spacer adjacent opposite sides of said sacrificial gate structure;

removing said sacrificial gate structure to thereby define a gate cavity that exposes a portion of said fin, wherein said gate cavity is laterally defined by said spacers; and forming a replacement gate structure in said gate cavity.

7. The method of claim 6, wherein said isolating insulating material is comprised of silicon dioxide, said etch stop layer is comprised of silicon nitride and said layer of insulating material is comprised of silicon dioxide.

8. The method of claim 6, wherein, prior to performing said at least one second etching process, performing a process operation on exposed portions of said layer of insulating material not covered by said patterned gate structure to form treated regions of said layer of insulating material.

9. The method of claim 8, wherein performing said process operation comprises performing one of a UV treatment process or a plasma treatment process on said layer of insulating material.

10. The method of claim 8, wherein performing said at least one second etching process removes said treated regions of said layer of insulating material.

11. A method of forming a FinFET device, comprising:
forming a plurality of trenches in a semiconducting substrate to thereby define a fin;
forming a sacrificial gate insulation layer on said fin;
forming a layer of insulating material above said sacrificial gate insulation layer;
forming a sacrificial gate electrode layer above said layer of insulating material;
forming a gate cap layer above said sacrificial gate electrode layer;
performing at least one first etching process on said gate cap layer and said sacrificial gate electrode layer to define a patterned gate structure comprised of a portion of said gate cap layer and a portion of said gate electrode layer;
performing a process operation on exposed portions of said layer of insulating material not covered by said patterned gate structure to form treated regions of said layer of insulating material;
performing at least one second etching process to remove said treated regions of said layer of insulating material, wherein said at least one second etching process stops on and exposes portions of said sacrificial gate insulation;
performing at least one third etching process to remove said exposed portions of said gate insulation layer to thereby define a sacrificial gate structure comprised of a portion of said sacrificial gate insulation layer, a portion of said layer of insulating material, said portion of said sacrificial gate electrode layer and said portion of said gate cap layer;
forming a sidewall spacer adjacent opposite sides of said sacrificial gate structure;

removing said sacrificial gate structure to thereby define a gate cavity that exposes a portion of said fin, wherein said gate cavity is laterally defined by said spacers; and forming a replacement gate structure in said gate cavity.

12. The method of claim 11, wherein performing said process operation comprises performing one of a UV treatment process or a plasma treatment process on said layer of insulating material.

13. The method of claim 11, wherein, prior to forming said gate insulation layer, forming a local isolation region comprised of an isolating insulating material in said trenches and forming an etch stop layer on said isolation regions.

14. The method of claim 13, wherein performing said at least one third etching process to remove said exposed portions of said gate insulation layer to thereby define said sacrificial gate structure stops on said etch stop layer.

15. A method of forming a FinFET device, comprising:
forming a plurality of trenches in a semiconducting substrate to thereby define a fin;
forming a local isolation region comprised of silicon dioxide in said trenches;
forming silicon nitride on said isolation regions;
forming a sacrificial gate insulation layer on said fin;
forming a layer of insulating material comprised of silicon dioxide on said sacrificial gate insulation layer;
forming a sacrificial gate electrode layer comprised of polysilicon on said layer of insulating material;
forming a gate cap layer comprised of silicon nitride on said sacrificial gate electrode layer;
performing at least one first etching process on said gate cap layer and said sacrificial gate electrode layer to define a patterned gate structure comprised of a portion of said gate cap layer and a portion of said sacrificial gate electrode layer, wherein said at least one first etching process stops on said layer of insulating material and exposes portions of said layer of insulating material;
performing a process operation on exposed portions of said layer of insulating material not covered by said patterned gate structure to form treated regions of said layer of insulating material;
performing at least one second etching process to remove said treated regions of said layer of insulating material, wherein said at least one second etching process stops on and exposes portions of said sacrificial gate insulation;
performing at least one third etching process to remove said exposed portions of said gate insulation layer to thereby define a sacrificial gate structure comprised of a portion of said sacrificial gate insulation layer, a portion of said layer of insulating material, said portion of said sacrificial gate electrode layer and said portion of said gate cap layer, wherein said at least one third etching process stops on said etch stop layer;
forming a sidewall spacer comprised of silicon nitride adjacent opposite sides of said sacrificial gate structure;
removing said sacrificial gate structure to thereby define a gate cavity that exposes a portion of said fin, wherein said gate cavity is laterally defined by said spacers; and
forming a replacement gate structure in said gate cavity.

16. The method of claim 15, wherein performing said process operation comprises performing one of a UV treatment process or a plasma treatment process on said layer of insulating material.

* * * * *